(12) United States Patent
Wang et al.

(10) Patent No.: US 10,333,505 B2
(45) Date of Patent: Jun. 25, 2019

(54) REPETITIVE IO STRUCTURE IN A PHY FOR SUPPORTING C-PHY COMPATIBLE STANDARD AND/OR D-PHY COMPATIBLE STANDARD

(71) Applicant: M31 Technology Corporation, Hsinchu County (TW)

(72) Inventors: Huai-Te Wang, Taoyuan (TW); Chih Chien Hung, Hsinchu County (TW)

(73) Assignee: M31 Technology Corporation, Hsinchu County (TW)

( * ) Notice: Subject to any disclaimer, the term of this patent is extended or adjusted under 35 U.S.C. 154(b) by 163 days.

(21) Appl. No.: 15/616,937

(22) Filed: Jun. 8, 2017

(65) Prior Publication Data
US 2018/0241382 A1    Aug. 23, 2018

Related U.S. Application Data

(60) Provisional application No. 62/461,247, filed on Feb. 21, 2017.

(51) Int. Cl.
| | |
|---|---|
| H03K 5/1252 | (2006.01) |
| G06F 13/40 | (2006.01) |
| H04L 25/00 | (2006.01) |
| H04B 3/02 | (2006.01) |

(52) U.S. Cl.
CPC ....... *H03K 5/1252* (2013.01); *G06F 13/4027* (2013.01); *G06F 13/4072* (2013.01); *H04B 3/02* (2013.01); *H04L 25/00* (2013.01)

(58) Field of Classification Search
CPC .... H03K 5/1252; H03K 5/14; G06F 13/4027; G06F 13/4072; H04L 7/0016; H04L 25/00; H04B 3/02
USPC .... 327/108–112, 427, 434, 437; 326/82, 83, 326/87; 341/94; 375/371
See application file for complete search history.

(56) References Cited

U.S. PATENT DOCUMENTS

| | | | |
|---|---|---|---|
| 6,215,816 B1 | 4/2001 | Gillespie | |
| 2012/0212200 A1 | 8/2012 | Amer | |
| 2014/0136750 A1* | 5/2014 | Hershko | G06F 13/385 710/316 |
| 2015/0229467 A1* | 8/2015 | Lee | H04L 7/0016 375/371 |

(Continued)

FOREIGN PATENT DOCUMENTS

| | | |
|---|---|---|
| CN | 1427474 A | 7/2003 |
| CN | 201621133 U | 11/2010 |

(Continued)

*Primary Examiner* — Tomi Skibinski
(74) *Attorney, Agent, or Firm* — Winston Hsu (57) ABSTRACT

A circuit in a physical unit (PHY) is disclosed, the circuit comprising two trios and a combo wire therebetween, wherein each of said trios includes three wires, and wherein said combo wire is configurable as a signal, floating, or any dc voltage, furthermore, a Quad-IO block is designed for transmit data in two D-PHY lanes with the combo wire configured as a signal wire or a C-PHY trio with the combo wire configured as a shielding wire, such that the same Quad-IO block can be instantiated multiple times in a physical unit for meeting different bandwidth requirements as well as for placing pads along a same direction for preventing performance difference between D-PHY lanes or C-PHY trios.

20 Claims, 12 Drawing Sheets

(56) References Cited

U.S. PATENT DOCUMENTS

2015/0370305 A1   12/2015  Wietfeldt
2018/0323952 A1*  11/2018  Chang ..................... H03K 5/14
2018/0350412 A1   12/2018  Lee

FOREIGN PATENT DOCUMENTS

| CN | 103823588   A  | 5/2014 |
| CN | 104581151   A  | 4/2015 |
| TW | 201707427   A  | 2/2017 |
| WO | 2017/023526 A1 | 2/2017 |

* cited by examiner

| 401 D0P-T0A | 402 D0N-T0B | 403 D1P-T0C | 404 D1N-T1A | 405 C0P-T1B | 406 C0N-T1C | 411 D2P-T2A | 412 D2N-T2B | 413 D3P-T2C | 414 D3N-TNA |
|---|---|---|---|---|---|---|---|---|---|
| DRV | DRV | DRV | DRV | DRV | DRV | DRV | DRV | DRV | DRV |
| PRE DRV | PRE DRV | PRE DRV | PRE DRV | PRE DRV | PRE DRV | PRE DRV | PRE DRV | PRE DRV | PRE DRV |
| Ser | Ser | Ser | Ser | Ser | Ser | Ser | Ser | Ser | Ser |
| LDO Group 1 420 | | | | | | LDO Group 2 430 | | | |

| 614<br>D0P-T0A | 624<br>D0N-T0B | 634<br>D1P-T0C | 644<br>D1N-TNA | |
|---|---|---|---|---|
| DRV 613 | DRV 623 | DRV 633 | DRV 643 | |
| PRE DRV 612 | PRE DRV 622 | PRE DRV 632 | PRE DRV 642 | |
| Ser 611 | Ser 621 | Ser 631 | Ser 641 | |
| LDO 650 | | | | |

| | 701<br>D0P-<br>T0A | 702<br>D0N-<br>T0B | 703<br>D1P-<br>T0C | 704<br>D1N-<br>TNA | 705<br>C0P-<br>T1A | 706<br>C0N-<br>T1B | 707<br>DNP-<br>T1C | 708<br>DNN-<br>TNA | 709<br>D2P-<br>T2A | 710<br>D2N-<br>T2B | 711<br>D3P-<br>T2C | 712<br>D3N-<br>TNA |
|---|---|---|---|---|---|---|---|---|---|---|---|---|
| | DRV | DRV | DRV | DRV | DRV | DRV | DRV | DRV | DRV | DRV | DRV | DRV |
| | PRE DRV | PRE DRV | PRE DRV | PRE DRV | PRE DRV | PRE DRV | PRE DRV | PRE DRV | PRE DRV | PRE DRV | PRE DRV | PRE DRV |
| | Ser | Ser | Ser | Ser | Ser | Ser | Ser | Ser | Ser | Ser | Ser | Ser |
| | LDO Group1 750 | | | | LDO Group2 751 | | | | LDO Group 3 752 | | | |

REPETITIVE IO STRUCTURE IN A PHY FOR SUPPORTING C-PHY COMPATIBLE STANDARD AND/OR D-PHY COMPATIBLE STANDARD

CROSS-REFERENCES TO RELATED APPLICATIONS

This application claims the benefit of U.S. Provisional Patent Application No. 62/461,247 filed on Feb. 21, 2017, which is hereby incorporated by reference herein and made a part of specification.

BACKGROUND OF THE INVENTION

1. Field of the Invention

The invention relates to IO architecture in physical layer and, in particular, but not exclusively, to multi-wire pad arrangement in the physical layer.

2. Description of the Prior Art

The Phy Working Group of the MIPI alliance has developed three specifications for high-speed physical layer designs to support multiple application requirements. The D-PHY standard was developed primarily to support camera and display applications using differential signals for transmitting data. The C-PHY standard is based on 3-Phase symbol encoding scheme delivering 2.28 bits per symbol over 3-wire trios, and targeting 2.5 Giga symbols per second. C-PHY has many characteristics in common with D-PHY as many parts of C-PHY were adapted from D-PHY. C-PHY was designed to be able to coexist on the same IC pins as D-PHY so that dual-mode devices can be developed.

Figure 1:
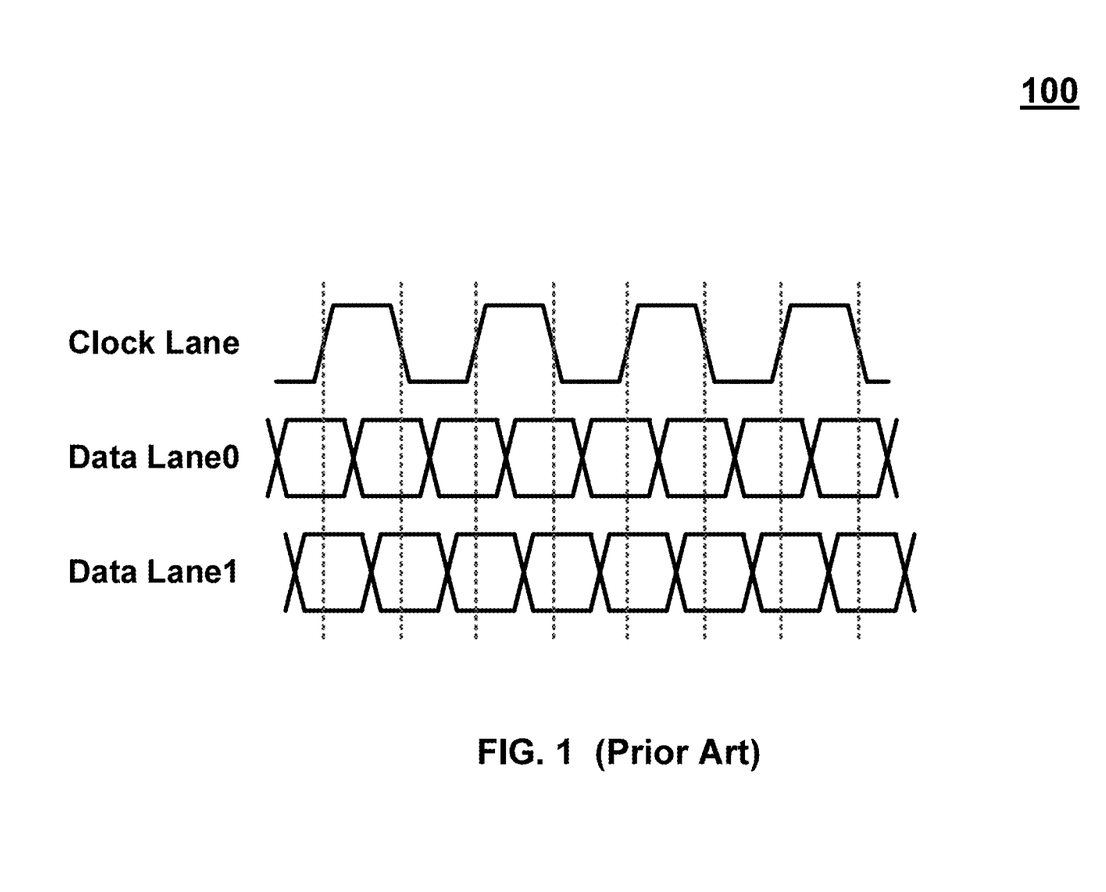
FIG. 1 illustrates a waveform diagram of transmitting data in lanes of D-PHY along with source-sync clock.

FIG. 1 shows a waveform diagram 100 of D-PHY, wherein each lane in D-PHY is a pair of differential wires. D-PHY usually has multiple lanes for transmitting data such as 4 Data lanes and 1 Clock lane for sampling data in the Data lanes, which is referred as 4D1C operation in D-PHY, wherein total 10 wires are used in 4D1C operation since each clock or data lane consists of a pair of differential signals.

Figure 2:
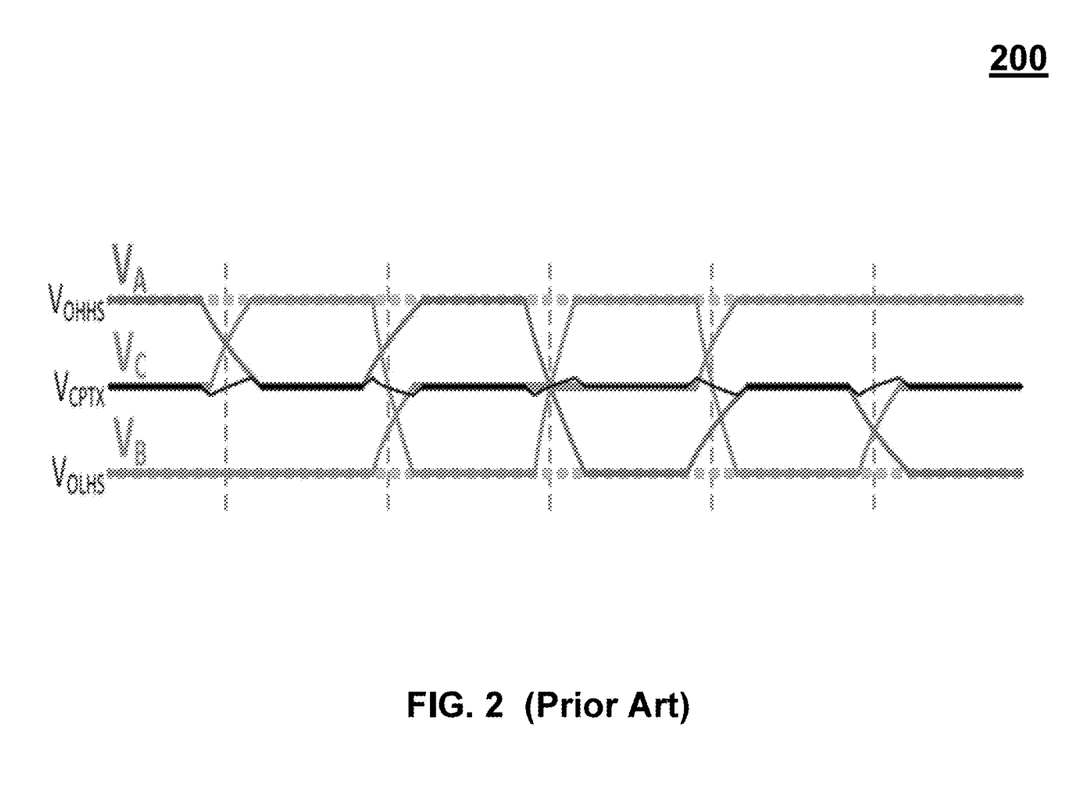
FIG. 2 illustrates a waveform diagram of transmitting data in a trio of C-PHY, wherein the trio of C-PHY has three single-ended wires for transmitting data.

FIG. 2 shows a waveform diagram 200 of C-PHY, wherein C-PHY uses 3 wires (which will be referred as a trio) for transmitting data. Multiple trios can be used to transmit data to meet bandwidth requirements in different applications. Each single-ended wire of C-PHY has three different voltage levels, namely, low-level (VL), common-mode (VCM) and high-level (VH), for encoding data therein.

In order to support a configurable or selectable design between D-PHY and C-PHY, conventionally, two different LDO regulators are used to support 3 differential pairs of D-PHY or 2 trios of C-PHY in one power domain, and two differential pairs of D-PHY or a trio of C-PHY in another power domain.

Figure 3A:
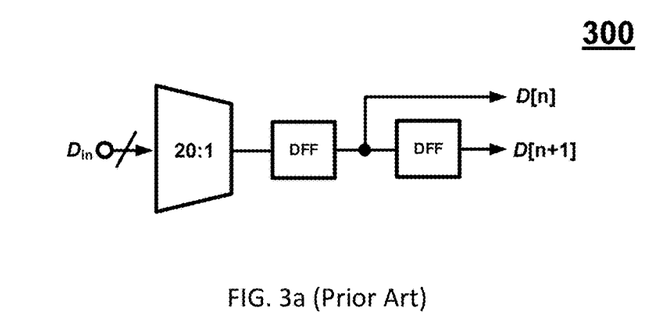
FIG. 3a illustrates a circuit to serialize parallel bits such as 20 bits and D(n) and D(n+1) being inputted to the circuit in FIG. 3b.
Figure 3B:
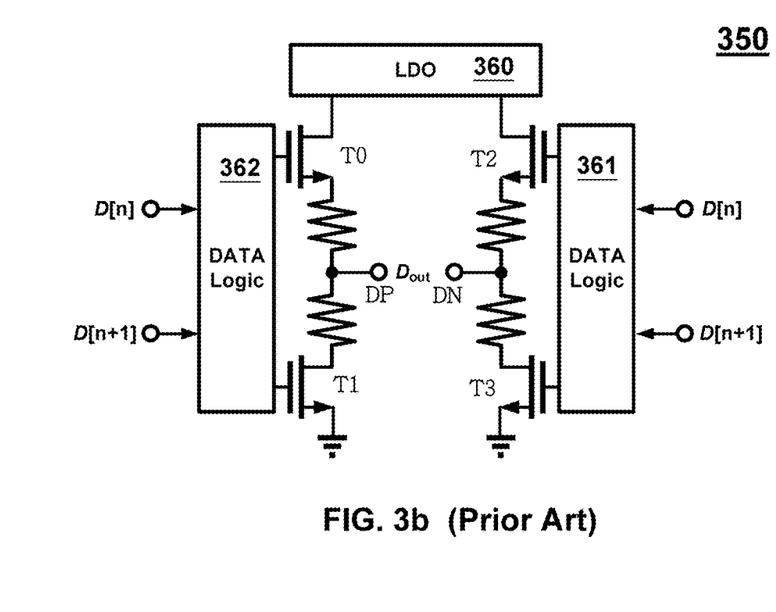
FIG. 3b illustrates a voltage-mode driver to generate a pair of differential output signals DP and DN using LDO regulator.

FIG. 3a shows a serializer 300 to convert a number of parallel bits, such as 20 bits, to serial bits for transmission, and the outputs D(n) and D(n+1) of the serializer 300 will be inputted to a voltage-mode driver 350 in a transmitter in FIG. 3b.

As shown in FIG. 3b, the voltage-mode driver 350 in a transmitter is used to generate a pair of differential signals DP and DN using the LDO regulator 360 so as to generate output voltage at DP and DN; the data logic block 362 takes the D(n) and D(n+1) as inputs and generates control signals to control gates of the transistor T0 and T1, and the data logic block 361 takes the D(n) and D(n+1) as inputs and generates control signals to control gates of the transistor T2 and T3. The differential signals driven by the DP and DN will be delivered to a remote receiver so as to form a current loop that passes through the transistor T0 and transistor T3, or transistor T2 and transistor T1, depending upon the voltage difference between DP and DN. A low-dropout or LDO regulator 360 is a DC linear voltage regulator that can regulate the output voltage.

Figure 4:
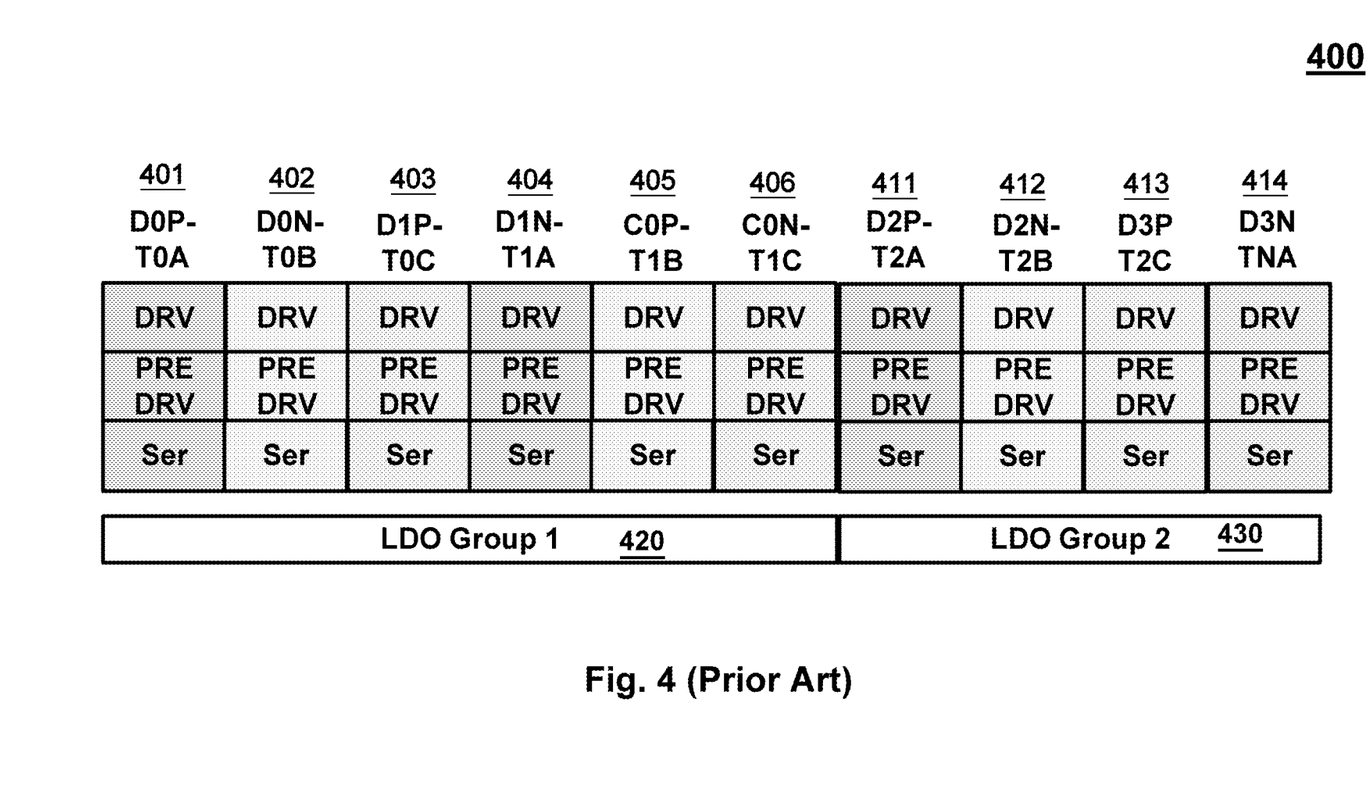
FIG. 4 illustrates a conventional diagram of IO blocks, wherein IO blocks are used for configuration between D-PHY and C-PHY.

FIG. 4 shows an IO block diagram 400 for presenting 4D1C (four data lanes and one clock lane) in D-PHY mode or 3-trio in C-PHY mode in a physical unit (PHY) having a 6-wire IO block in the LDO group 1 420 and another 4-wire IO block in the LDO group 2 430. That is, two kinds of IO blocks with different number of wires are instantiated in a single physical unit. The 6-wire IO block in the LDO group 1 420 transmits signals on six wires, namely, D0P/T0A 401, D0N/T0B 402, D1P/T0C 403, D1N/T1A 404, C0P/T1B 405 and C0N/T1C 406; and the 4-wire IO block in the LDO group 2 430 transmits signals on four wires, namely, D2P/T2A 411, D2N/T2B 412, D3P/T2C 413 and D3N/TNA 414. When the PHY is configured as a D-PHY mode, D0P-D0N 401, 402, D1P-D1N 403, 404, and C0P-C0N 405, 406 under LDO 420 are used for transmitting three pairs of differential signals of D-PHY, wherein C0P-C0N 405, 406 transmit the clock in a clock lane and D0P-D0N 401, 402, D1P-D1N 403, 404 transmit the data in two data lanes. Similarly, D2P/T2A 411, D2N/T2B 412, D3P/T2C 413, D3N/TNA 414 under LDO 430 are used for transmitting two pairs of differential signals in two data lanes. When the PHY is configured as a C-PHY mode, T0A-T0B-T0C 401, 402, 403 in LDO 420 is used for transmitting three signals as a first trio of C-PHY, and T1A-T1B-T1C 404, 405, 406 under the same LDO 420 is used for transmitting three single-ended signals as a second trio of C-PHY. Similarly, T2A-T2B-T2C 411, 412, 413 under LDO 430 is used for transmitting three single-ended signals as a third trio of C-PHY. TNA 414 is not used in C-PHY mode.

Figure 5A:
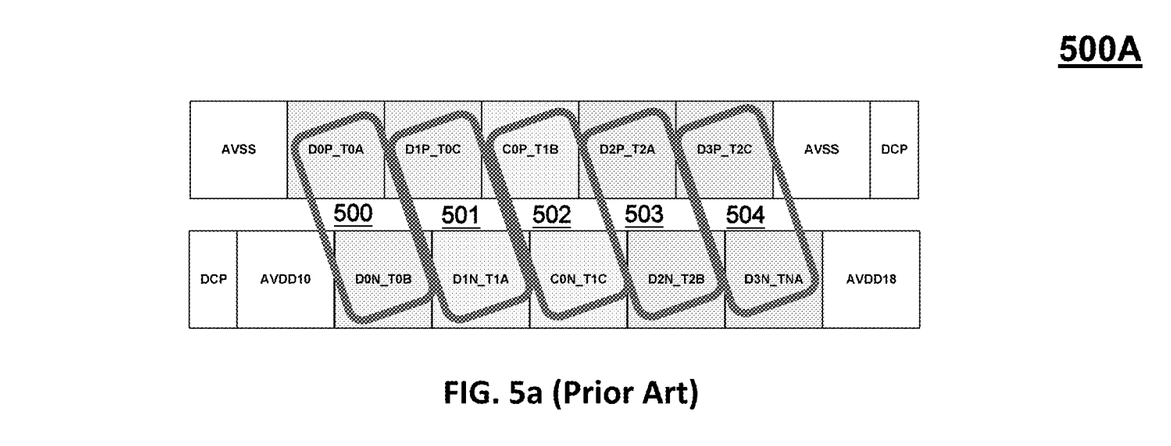
FIG. 5a-5b illustrates two traditional pad arrangements.

FIG. 5a shows a traditional pad arrangement 500A with die pads enclosed in blocks 500, 501, 502, 503, 504 in which crosstalk occurred between two adjacent trio pads in C-PHY mode so as to cause a worse SNR (signal-to-noise ratio) than D-PHY. It is noted that the grey rectangular blocks are illustrated for D-PHY, and not shown for C-PHY.

Figure 5B:
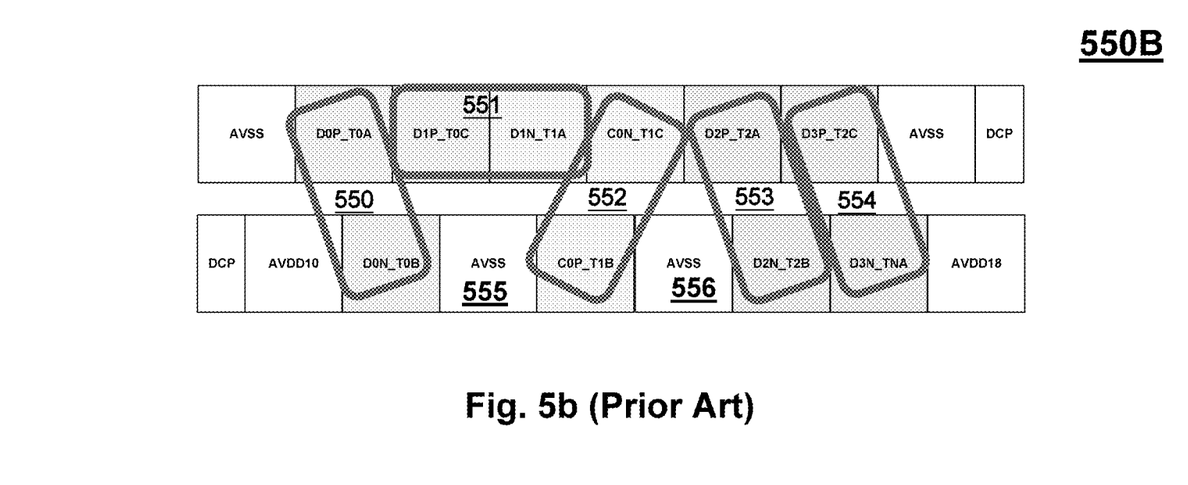

FIG. 5b shows another traditional pad arrangement 500B with die pads enclosed in blocks 550, 551, 552, 553, 554 in which pad(s) 555, 556 are reserved to mitigate crosstalk in C-PHY; however, the asymmetrical pad arrangement of the IO blocks 550, 551, 552, 553, 554 is disadvantageous to D-PHY such that it will cause performance issues, such as jitter measurement and/or troublesome design between different lanes of D-PHY. Referring back to FIGS. 4 and 5b, two trios T0 (T0A, T0B, T0C) and T1 (T1A, T1B, T1C) are shared under the same LDO 420, it will also cause another problem of power interference.

Furthermore, from SNR point of view, C-PHY will be more susceptible to noise due to the fact that each C-HPY trio uses three single-ended wires for transmission. In addition, $A_{D\text{-}PHY}=0.2$, $A_{C\text{-}PHY}=0.25/2$, given a same Crosstalk, the $SNR_{C\text{-}PHY}$ is less than $SNR_{D\text{-}PHY}$ by −4 dB. As a result, CPHY requires a better mechanism so as to reduce signal interference between adjacent trios.

Therefore, a better way to design a physical unit (PHY) supporting both D-PHY and C-PHY or other compatible physical layer structure is needed to resolve the above-mentioned issues.

SUMMARY OF THE INVENTION

It is one objective of this invention to provide a Quad-IO block supporting both D-PHY and C-PHY, and multiple Quad-IO blocks can be used for meeting different bandwidth requirements, thereby a symmetry structure of pad arrangement can be obtained in a repetitive way so as to reduce performance differences, such as jitter difference, between different lanes of D-PHY. Therefore, it reduces a designer's effort significantly in circuit design and verification, for example, measured in a consistent way (the least measure time), including jitter, eye opening, crosstalk, and etc. Such symmetry structure can reduce measurement time significantly.

It is another objective of this invention to provide a shielding wire between each two adjacent trios of C-PHY so as to reduce signal interference between each two adjacent trios of C-PHY. Besides, each trio in each Quad-IO block has its own LDO power domain so as to prevent power interference from the other adjacent trio. It's noted that the Quad-IO blocks can be operated in either C-PHY mode or dual mode (configurable between D-PHY and C-PHY).

In one embodiment, a circuit in a physical unit (PHY) comprising two trios and a shielding wire, wherein each of said trios includes three signal wires for transmitting signals, and said shielding wire is between said two trios for reducing a signal interference between said two trios.

In one embodiment, wherein said circuit comprises at least two Quad-IO blocks, wherein a first Quad-IO block comprises a first trio and a first shielding wire, and a second Quad-IO block comprises a second trio and a second shielding wire, the first shielding wire being between the first trio and the second trio for reducing the signal interference between said two trios.

In one embodiment, wherein each of the first shielding wire and the second shielding wire is capable of being configured as floating or at any dc voltage.

In one embodiment, wherein said at least two Quad-IO blocks are arranged side by side so as to form a repetitive structure of staggered bond pads, wherein each of said wires is electrically coupled to a corresponding pad of the repetitive structure of staggered bond pads.

In one embodiment, wherein said at least two Quad-IO blocks are arranged side by side so as to form a repetitive structure of in-line pads, wherein each of said wires is electrically coupled to a corresponding pad of the repetitive structure of in-line pads.

In one embodiment, wherein each of said at least two Quad-IO blocks is operatable under a dedicated LDO power domain so as to prevent a power interference.

In one embodiment, wherein for each of said three signal wires in a Quad-IO block, said Quad-IO block is located at a corresponding transmitter comprising a pre-driver and a driver for transmitting data to the signal wire.

In one embodiment, wherein for each of said three signal wires in a Quad-IO block, said Quad-IO block is located at a corresponding receiver for receiving data from the signal wire.

In one embodiment, wherein for each of the said signal wires in a Quad-IO block, said Quad-IO block is located at a corresponding transmitter for transmitting data to the signal wire and a corresponding receiver for receiving data from the signal wire.

In one embodiment, wherein the circuit is compliant with C-PHY.

In one embodiment, a circuit in a physical unit (PHY) comprising two trios and a combo wire therebetween, wherein each of said trios includes three signal wires for transmitting signals, and wherein said combo wire is configurable as a signal wire for transmitting a corresponding signal when the circuit is operating in a first mode or as a shielding wire for reducing a signal interference between said two trios when the circuit is operating in a second mode.

In one embodiment, wherein said circuit comprises at least two Quad-IO blocks, wherein a first Quad-IO block comprises a first trio and a first combo wire, and a second Quad-IO block comprises a second trio and a second combo wire, the first combo wire being between the first trio and the second trio.

In one embodiment, wherein when said combo wire is configured as the shielding wire in the second mode, said shielding wire is capable of being configured as floating or at any dc voltage for reducing the signal interference between said two trios.

In one embodiment, wherein the first mode is D-PHY and the second mode is C-PHY.

In one embodiment, wherein each of said at least two Quad-IO blocks is operatable under a dedicated LDO power domain so as to prevent a power interference.

In one embodiment, wherein each Quad-IO block includes 2 differential pairs suitable or adaptable in one of said two modes.

In one embodiment, wherein said at least two Quad-IO blocks are arranged side by side so as to form a repetitive structure of staggered bond pads, wherein each of said wires is electrically coupled to a corresponding pad of the repetitive structure of staggered bond pads.

In one embodiment, wherein said at least two Quad-IO blocks are arranged side by side so as to form a repetitive structure of in-line pads, wherein each of said wires is electrically coupled to a corresponding pad of the repetitive structure of in-line pads.

In one embodiment, wherein for each of said thee signal wires in a Quad-IO block, said Quad-IO block is located at a corresponding transmitter comprising a pre-driver and a driver for transmitting data to the signal wire.

In one embodiment, wherein for each of said thee signal wires in a Quad-IO block, said Quad-IO block is located at a corresponding receiver for receiving data from the signal wire.

In one embodiment, wherein the PHY circuit is included in a receiver that receives data from the two trios.

In one embodiment, wherein the PHY circuit is included in a transceiver that transmit or receive data to/from the two trios.

With the brief description of drawings and detailed description of embodiment disclosed below, advantage, scope, and technical details of this invention are easy to be understood.

DETAILED DESCRIPTION OF EMBODIMENT

The detailed explanation of the present invention is described as following. The described preferred embodiments are presented for purposes of illustrations and description, and they are not intended to limit the scope of the present invention.

The present invention discloses a circuit in a physical unit (PHY), the circuit operated in C-PHY mode comprising two trios and a combo wire therebetween, wherein each of said trios includes three wires, and wherein the combo wire is configurable as floating, grounded or any dc voltage to act as shielding. In one embodiment, a circuit in a physical unit (PHY) comprises two trios and a shielding wire therebetween, wherein each of said trios includes three wires; and wherein said combo wire is configurable as a signal wire when the circuit is operating in a first mode (D-PHY). The shielding wire is either floating, grounded or at any dc voltage for reducing a signal interference between said two adjacent trios when C-PHY is used.

Furthermore, in one embodiment according to present invention, a Quad-IO block is designed for transmitting data in two D-PHY lanes with the combo wire configured as a signal, or a C-PHY trio with the combo wire configured as a shielding wire to reduce a signal interference between two adjacent C-PHY trios. In addition, the same Quad-IO block can be instantiated multiple times in a physical unit for meeting different bandwidth requirements.

Figure 6:
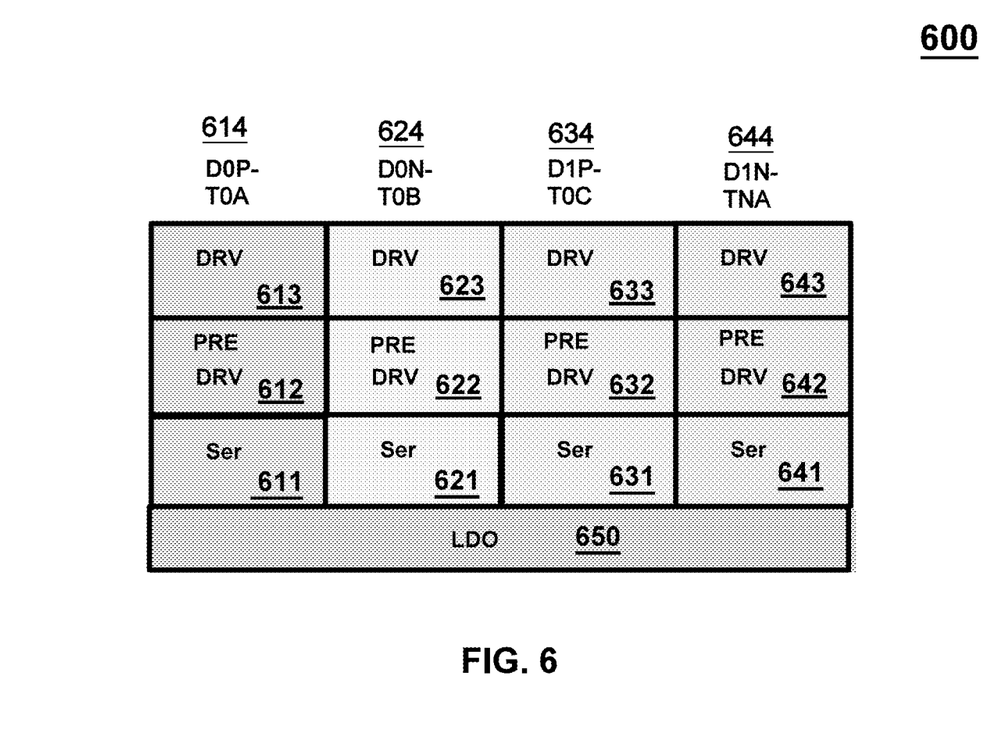
FIG. 6 illustrates a Quad-IO block in accordance with one embodiment of present invention for transmit four signals, namely, D0P/T0A, D0N/T0B, D1P/T0C, and D1N/TNA.

Please note that the Quad-IO block can be adapted and applied to other physical layer structures as well, and not limited to only C-PHY and/or D-PHY As shown in FIG. 6, the Quad-IO block 600 contains four wires, namely, D0P/T0A 614, D0N/T0B 624, D1P/T0C 634, and D1N/TNA 644. Wire D0P/T0A 614 has a corresponding data path inside the Quad-IO block 600, namely, a serializer 611, a pre-drive 612 and a drive 613; Wire D0N/T0B 624 has a corresponding data path inside the Quad-IO block 600, namely, a serializer 621, a pre-drive 622 and a drive 623; Wire D1P/T0C 634 has a corresponding data path inside the Quad-IO block 600, namely, a serializer 631, a pre-drive 632 and a drive 633; Wire D1N/TNA 644 has a corresponding data path inside the Quad-IO block 600, namely, a serializer 641, a pre-drive 642 and a drive 643. Please note that although the elements in Quad-IO block 600 are labeled differently, they can share a same circuit or combined in certain way, the present invention is not limited to the implementations of the Quad-IO block 600. The four wires, D0P 614, D0N 624, D1P 634 and D1N 644, are used for transmitting two pairs of differential signals in D-PHY mode; and the three wires (or trio), T0A 614, T0B 624, and T0C 634, are used for transmitting three single-ended signals C-PHY mode, and the combo wire TNA 644 can be programmed to ground or a constant dc-voltage through on-die pull-down circuit to provide isolation between different Quad-IO block so as to reduce the interference between two adjacent two trios of C-PHY on a chip package or a PCB in C-PHY mode. Each said wire on a die will be electrically connected or coupled to a die pad for electrically connecting with a pad on a chip package. Quad-IO block 600 has its own LDO 650 power domain. Please note that there are many ways to implement the Quad-IO block 600 and some of the circuit in the Quad-IO block 600 can be removed to outside of the Quad-IO block 600 to meet different application requirements. For example, LDO 650 can be located outside of the Quad-IO block 600.

Figure 7:
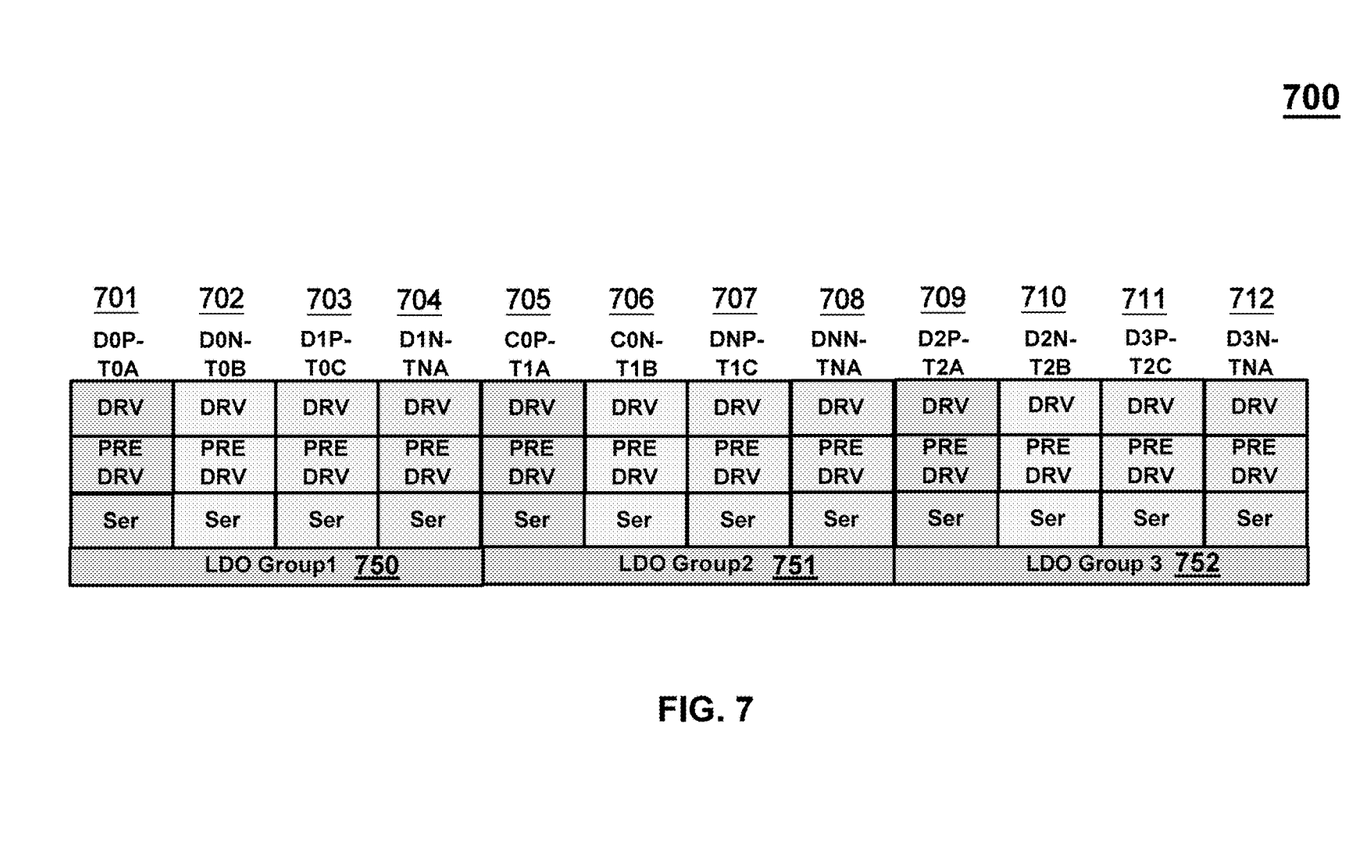
FIG. 7 illustrates a block diagram for 4D1C/3-Trio PHY in accordance with one embodiment of present invention, wherein three Quad-IO blocks of FIG. 6 are instantiated in a single physical unit (PHY)

As shown in FIG. 7, a circuit block diagram of a physical unit (PHY) 700 can be used to transmit 4 data lanes of D-PHY or 3 trios of C-PHY, which can be referred as 4D1C/3-Trios operations, wherein three Quad-IO blocks 600 of FIG. 6 can be instantiated in a single physical unit (PHY) 700, namely, the first Quad-IO block, the second Quad-IO block, and the third Quad-IO block. The first Quad-IO block is powered by the LDO group 1 750 and contains four wires, namely, D0P/T0A 701, D0N/T0B 702, D1P/T0C 703 and D1N/TNA 704, wherein D0P 701, D0N 702, D1P 703 and D1N 704, are used for transmitting two pairs of differential signals of D-PHY; and three wires, T0A 701, T0B 702, and T0C 703, are used for transmitting three single-ended signals for a first trio of C-PHY, and the combo wire TNA 704 can be programmed to ground or a constant dc-voltage through on-die pull-down circuit to provide isolation between different Quad-IO block on a chip package or a PCB in C-PHY mode for reducing an interference between two adjacent trios.

The second Quad-IO block is powered by the LDO group 2 751 and contains four wires, namely, C0P/T1A 705, C0N/T1B 706, DNP/T1C 707 and DNN/TNA 708, wherein C0P-C0N 705,706, is a pair of differential signals for transmitting the clock of D-PHY, and DNP-DNN 707,708 can be floating or programmed to ground or a constant dc-voltage through on-die pull-down circuit to provide isolation between different Quad-IO block on a chip package or PCB in D-PHY mode; and three wires, T1A 705, T1B 706 and T1C 707, are used for transmitting three single-ended signals in a second trio of the C-PHY, and the combo wire: TNA 708 can be programmed to ground or a constant dc-voltage through on-die pull-down circuit to provide isolation between different Quad-IO block on a chip package or a PCB in C-PHY mode.

The third Quad-IO block is powered by the LDO group 2 752 and contains four wires, namely, D2P/T2A 709, D2N/T2B 710, D3P/T2C 711 and D3N/TNA 712, wherein four wires D2P 709, D2N 710, D3P 711, and D3N 712 are used for transmitting two pairs of differential signals, in D-PHY mode; and three wires, T2A 709, T2B 710 and T2C 711, are used for transmitting three single-ended signal as a third trio of the C-PHY, and the combo wire TNA 712 can be programmed to ground through on-die pull-down circuit to provide isolation between different Quad-IO block on a chip package or PCB in C-PHY mode.

Figure 8:
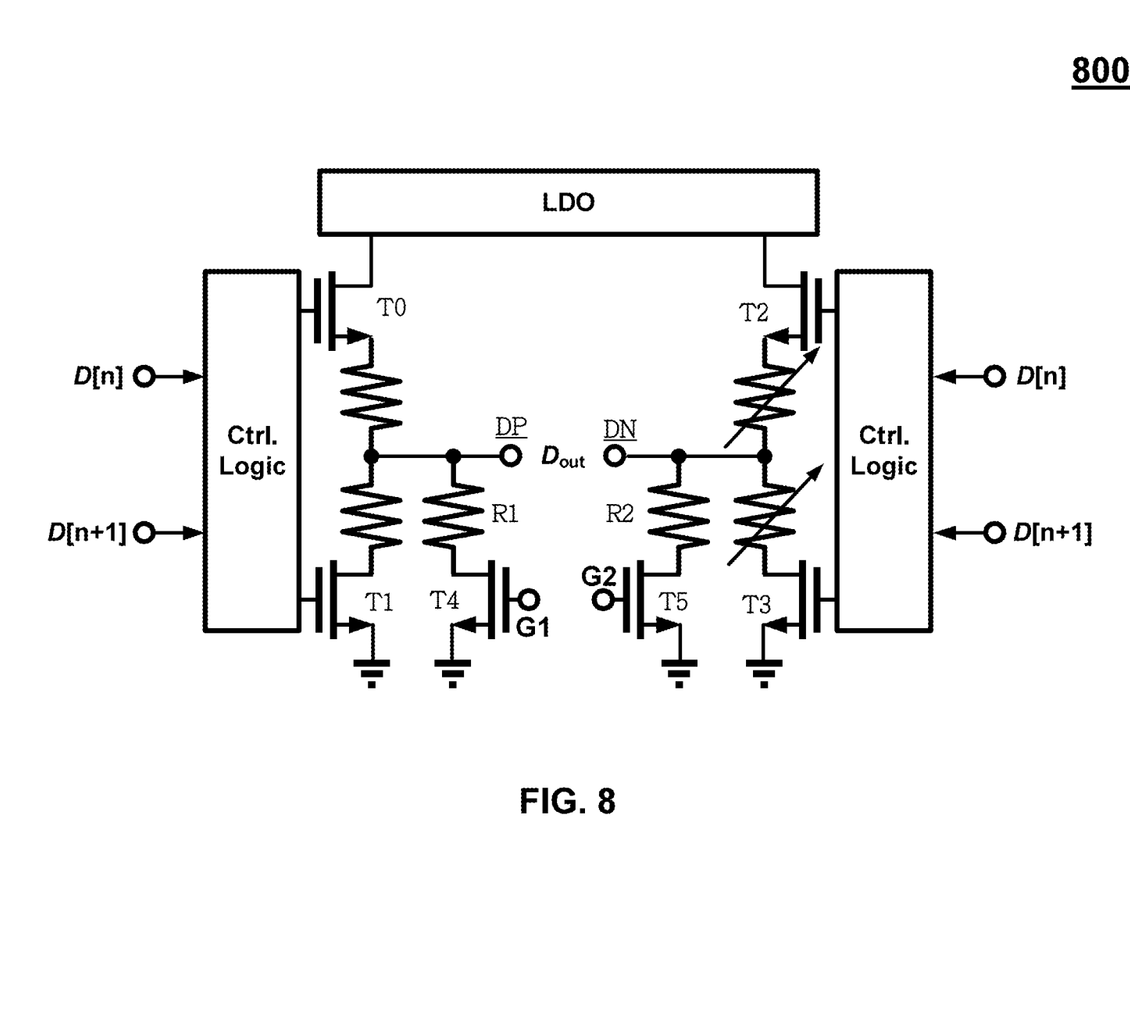
FIG. 8 illustrates a driver in accordance with one embodiment of present invention for generating a pair of differential signals DP and DN under one LDO.

FIG. 8 shows a transmitter 800 for generating a pair of differential signals DP and DN, wherein a transistor T4 is coupled to the DP through a resistor R1, and a transistor T5 is coupled to the DN through a resistor R2, wherein when a control signal to the gate G1 of the transistor T4 is active, the transistor T4 will be turned on and the DP will be connected to the ground through transistor T4 and the resistor R1; and when a control signal to the gate G2 of the transistor T5 is active, the transistor T5 will be turned on and the DN will be connected to the ground through transistor T5 and the resistor R2. Please note that only transistor T5 and the resistor R2 are needed to be grounded in certain applications. For example, only one node DN needs to be connected to ground for shielding purpose in C-PHY mode.

Figure 9:
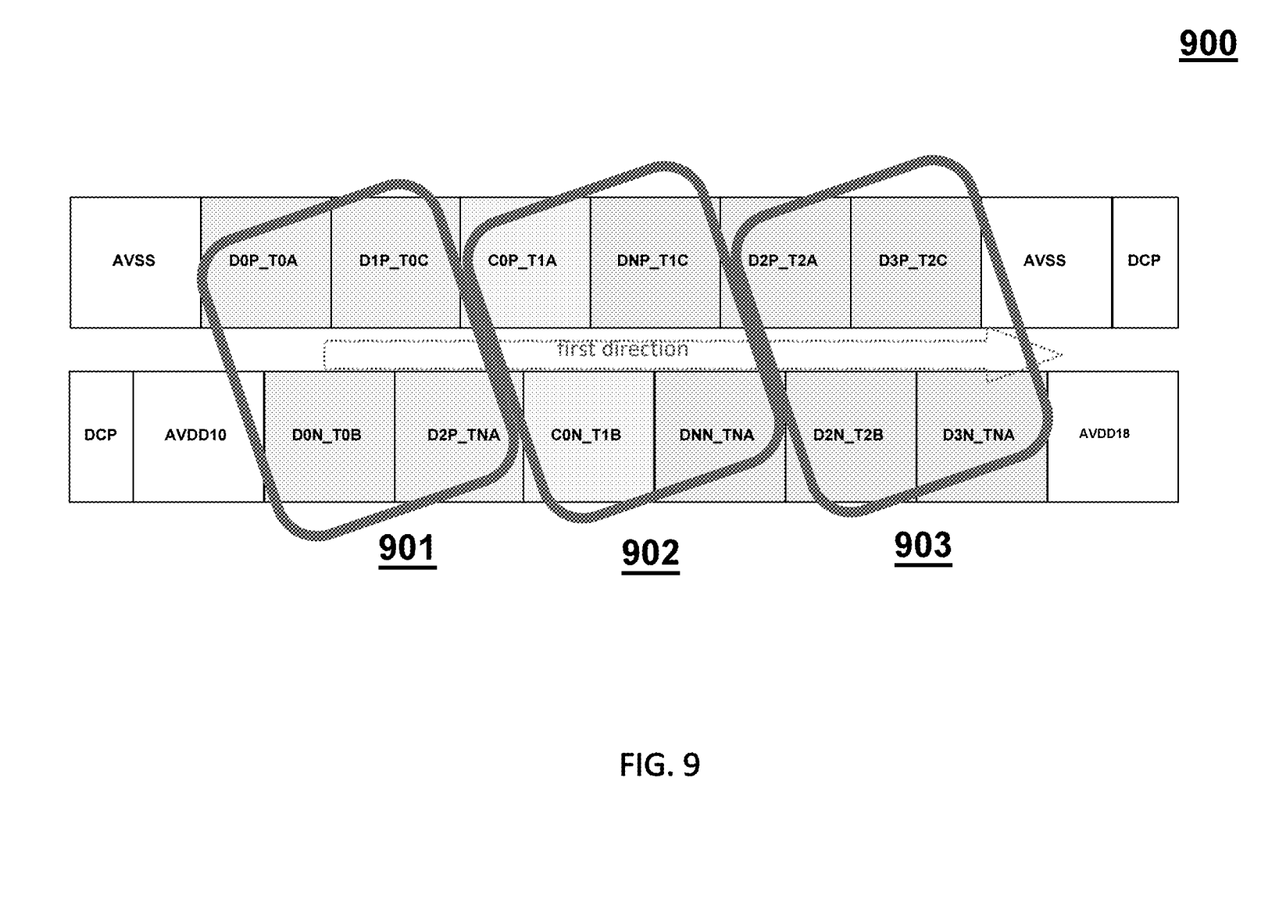
FIG. 9 illustrates pad arrangements in accordance with one embodiment of present invention based on the Quad-IO blocks of FIGS. 6 and 7.

FIG. 9 shows a pad-arrangement diagram 900 according to one embodiment of the present invention. Since multiple Quad-IO blocks 600 are instantiated in a physical unit (PHY) 700, the die pads enclosed in blocks 901, 902, 903 are placed repetitively along the same direction, as shown in FIG. 9.

Figure 10A:
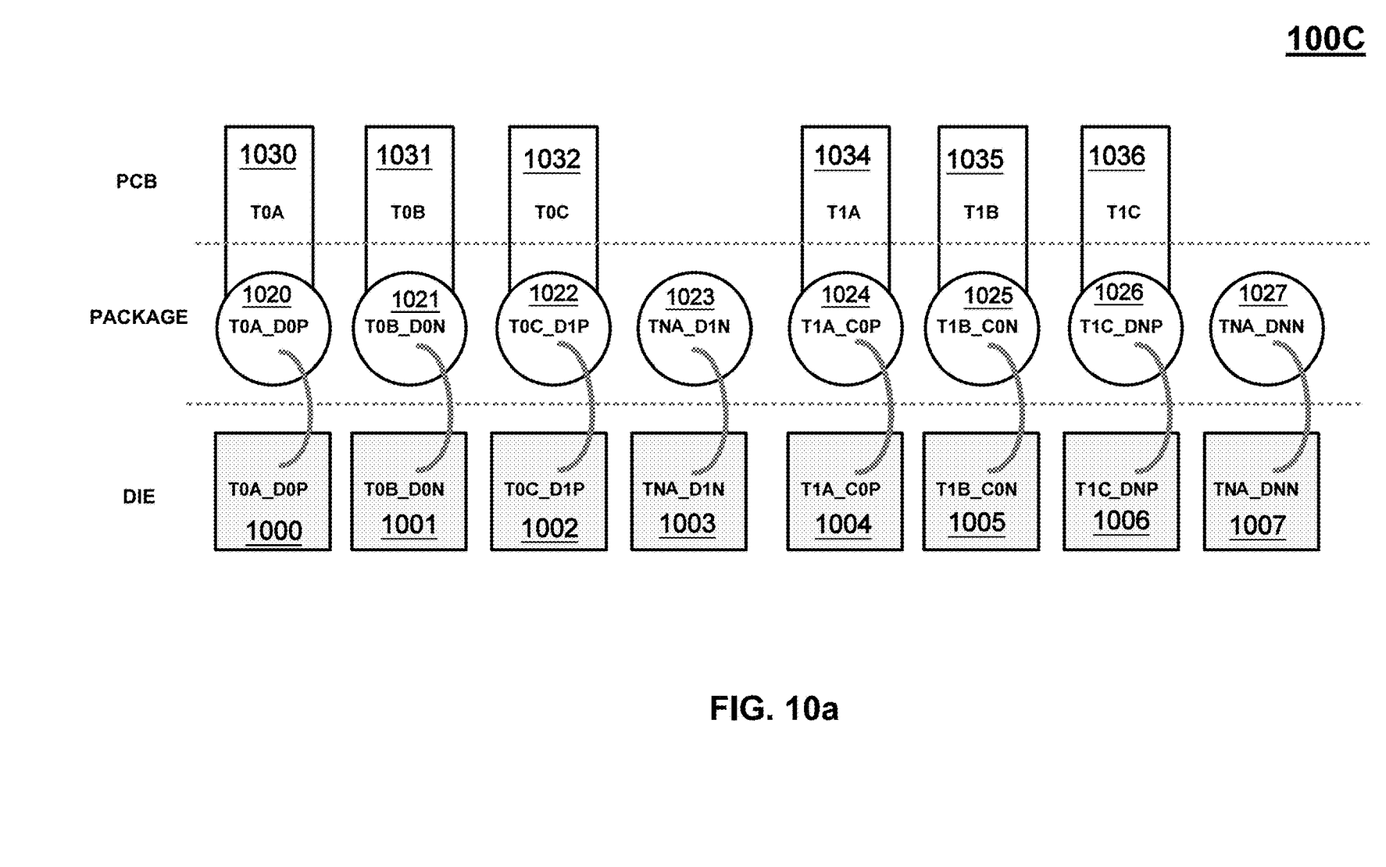
FIG. 10a illustrates Quad-IO pads in a die configured for C-PHY mode that can be connected to the corresponding pins via wire bonds for package that can be coupled to the corresponding traces in PCB in accordance with one embodiment of present invention.

FIG. 10*a* shows a pad-arrangement diagram 100C in C-PHY mode according to one embodiment of the present invention, wherein the die pads 1000, 1001, 1002, 1003, 1004, 1005, 1006, 1007 can be easily connected to the pads 1020, 1021, 1022, 1023, 1024, 1025, 1026, 1027 of the chip package, and the pads 1020, 1021, 1022, 1024, 1025, 1026 of the chip package can be easily connected to pads 1030, 1031, 1032, 1034, 1035, 1036 of a PCB. Please note that the pads 1023, 1027 on the chip package can also be connected to the PCB for shielding purpose between the trios of C-PHY on the PCB.

Figure 10B:
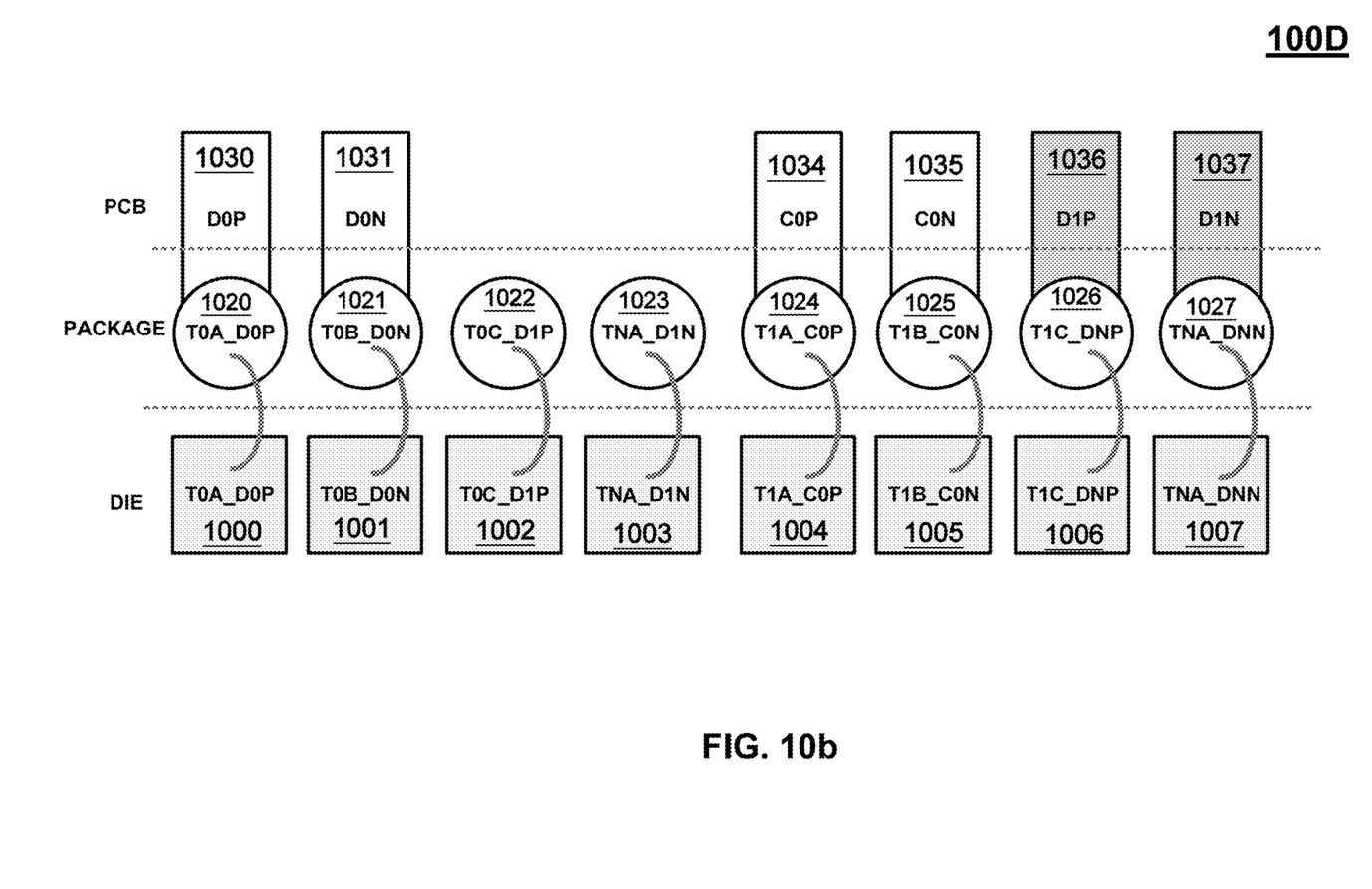
FIG. 10b illustrates Quad-IO pads in a die configured for D-PHY mode that can be attached to the corresponding pins via wire bonds for package that can be coupled to the corresponding traces in PCB in accordance with one embodiment of present invention.

FIG. 10*b* shows a pad-arrangement diagram 100D in D-PHY mode according to one embodiment of the present invention, wherein the die pads 1000, 1001, 1002, 1003, 1004, 1005, 1006, 1007 can be easily connected to the pads 1020, 1021, 1022, 1023, 1024, 1025, 1026, 1027 of the chip package, and the pads 1020, 1021, 1024, 1025, 1026, 1027 of the chip package can be easily connected to pads 1030, 1031, 1034, 1035, 1036, 1037 of a PCB.

Figure 11:
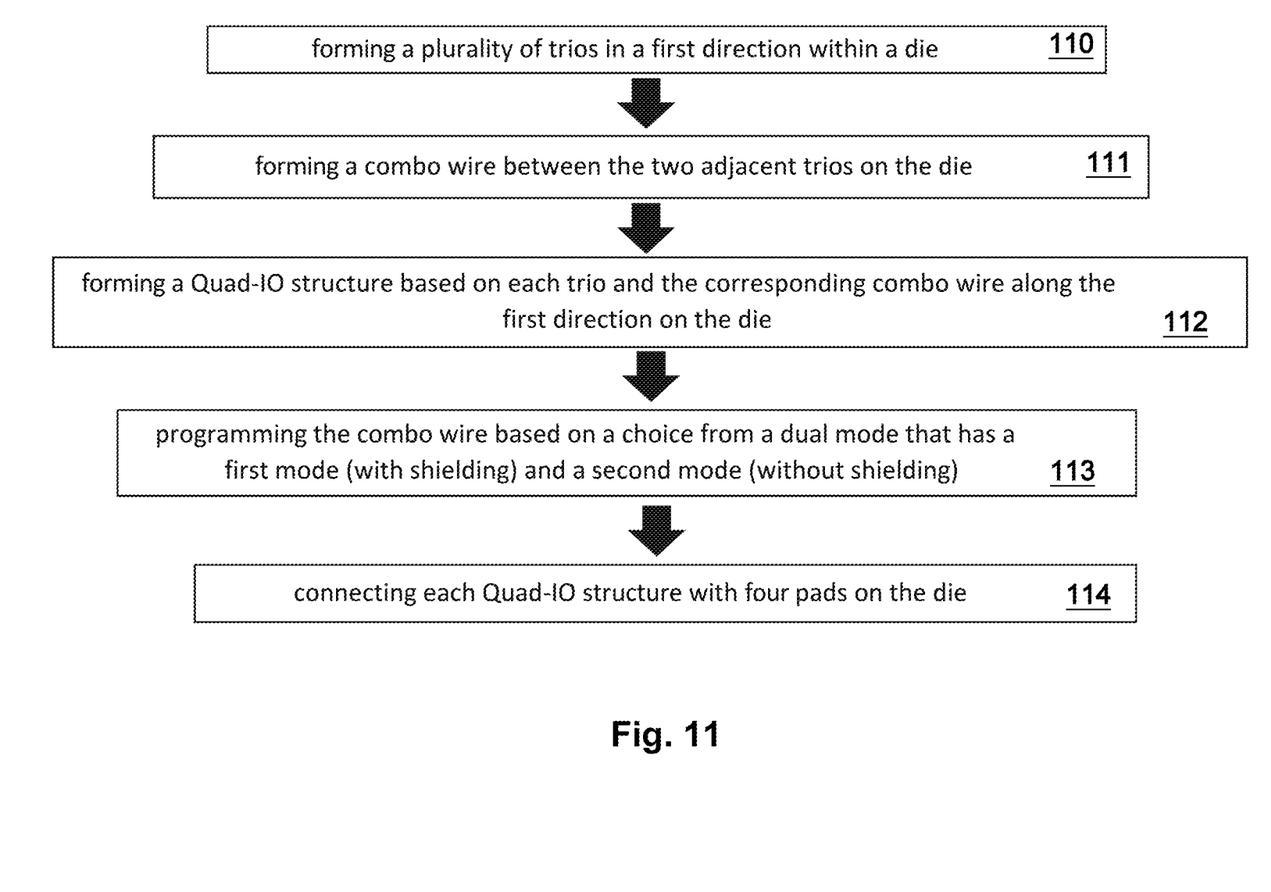
FIG. 11 illustrates a flow chart of a method for forming Quad-IO pads within a die.

In one embodiment of the present invention, a method to implement an IO circuit in a physical unit is disclosed. As shown in FIG. 11, in step 110, forming a plurality of trios along a first direction; in step 111, forming a combo wire between two adjacent trios on the die; in the step 112, forming a Quad-IO block based on each trio and the corresponding combo wire along the first direction on the die; in step 113, programming the combo wire based on the choice from a dual mode that has a first mode (with shielding) and a second mode (without shielding) based on each trio and the corresponding combo wire along the first direction on the die; and in step 114, connecting each Quad-IO block with four pads on the die. Other descriptions of this method can be referred to the corresponding descriptions of FIG. 6, FIG. 7, FIG. 8, FIG. 9, FIG. 10*a*, and FIG. 10*b*, and it will not be described further.

In summary, the repetitive structure of the Quad-IO blocks according to the present invention has many advantages which includes: (1) the signal interference between two adjacent trios in CPHY can be reduced by using a shielding wire between said two adjacent trios; (2) the power interference can be reduced by using a dedicated LDO for each Quad-IO block; (3) it is applicable to both CPHY & DPHY or other compatible physical layer structure; (4) pad bonding wires can be arranged in order without crossing one another; and (5) all wires of the Quad-IO blocks can be measured in a consistent way (such as least measure time), including jitter, eye opening, crosstalk, and etc., which can reduce measurement time significantly. Besides, either "wire bonding", "flip-chip bonding" or combination therebetween can be applied in the claimed invention.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A circuit in a physical unit (PHY) comprising two trios and a shielding wire, wherein each of said trios includes three signal wires for transmitting signals, and said shielding wire is between said two trios for reducing a signal interference between said two trios.

2. The circuit of the claim 1, wherein said circuit comprises at least two Quad-IO blocks, wherein a first Quad-IO block comprises a first trio and a first shielding wire, and a second Quad-IO block comprises a second trio and a second shielding wire, the first shielding wire being between the first trio and the second trio for reducing the signal interference between said two trios.

3. The circuit of the claim 2, wherein each of the first shielding wire and the second shielding wire is capable of being configured as floating or at any dc voltage.

4. The circuit of the claim 2, wherein said at least two Quad-IO blocks are arranged side by side so as to form a repetitive structure of staggered bond pads, wherein each of said wires is electrically coupled to a corresponding pad of the repetitive structure of staggered bond pads.

5. The circuit of the claim 2, wherein said at least two Quad-IO blocks are arranged side by side so as to form a repetitive structure of in-line pads, wherein each of said wires is electrically coupled to a corresponding pad of the repetitive structure of in-line pads.

6. The circuit of the claim 2, wherein each of said at least two Quad-IO blocks is operatable under a dedicated LDO power domain so as to prevent a power interference.

7. The circuit of the claim 2, wherein the circuit is compliant with C-PHY.

8. The circuit of the claim 2, wherein for each of said three signal wires in a Quad-IO block, said Quad-IO block is located at a corresponding transmitter comprising a pre-driver and a driver for transmitting data to the signal wire.

9. The circuit of the claim 2, wherein for each of said three signal wires in a Quad-IO block, said Quad-IO block is located at a corresponding receiver for receiving data from the signal wire.

10. The circuit of the claim 2, wherein for each of the said signal wires in a Quad-IO block, said Quad-IO block is located at a corresponding transmitter for transmitting data to the signal wire and a corresponding receiver for receiving data from the signal wire.

11. A circuit in a physical unit (PHY) comprising two trios and a combo wire therebetween, wherein each of said trios includes three signal wires for transmitting signals, and wherein said combo wire is configurable as a signal wire for transmitting a corresponding signal when the circuit is operating in a first mode or as a shielding wire for reducing a signal interference between said two trios when the circuit is operating in a second mode.

12. The circuit of the claim 11, wherein said circuit comprises at least two Quad-IO blocks, wherein a first Quad-IO block comprises a first trio and a first combo wire, and a second Quad-IO block comprises a second trio and a second combo wire, the first combo wire being between the first trio and the second trio.

13. The circuit of the claim 12, wherein each of said at least two Quad-IO blocks is operatable under a dedicated LDO power domain so as to prevent a power interference.

14. The circuit of the claim 12, wherein each Quad-IO block includes 2 differential pairs suitable or adaptable in one of said two modes.

15. The circuit of the claim 12, wherein said at least two Quad-IO blocks are arranged side by side so as to form a repetitive structure of staggered bond pads, wherein each of said wires is electrically coupled to a corresponding pad of the repetitive structure of staggered bond pads.

16. The circuit of the claim 12, wherein said at least two Quad-IO blocks are arranged side by side so as to form a repetitive structure of in-line pads, wherein each of said wires is electrically coupled to a corresponding pad of the repetitive structure of in-line pads.

17. The circuit of the claim 12, wherein for each of said thee signal wires in a Quad-IO block, said Quad-IO block is located at a corresponding transmitter comprising a pre-driver and a driver for transmitting data to the signal wire.

18. The circuit of the claim 12, wherein for each of said thee signal wires in a Quad-IO block, said Quad-IO block is located at a corresponding receiver for receiving data from the signal wire.

19. The circuit of the claim 11, wherein when said combo wire is configured as the shielding wire in the second mode, said shielding wire is capable of being configured as floating or at any dc voltage for reducing the signal interference between said two trios.

20. The circuit of the claim 11 wherein the first mode is D-PHY and the second mode is C-PHY.

* * * * *